US009418995B2

(12) United States Patent
Kannan et al.

(10) Patent No.: US 9,418,995 B2
(45) Date of Patent: Aug. 16, 2016

(54) METHOD AND STRUCTURE FOR TRANSISTORS USING GATE STACK DOPANTS WITH MINIMAL NITROGEN PENETRATION

(71) Applicant: GLOBALFOUNDRIES Inc., Grand Cayman (KY)

(72) Inventors: Balaji Kannan, Fishkill, NY (US); Unoh Kwon, Fishkill, NY (US); Rekha Rajaram, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 38 days.

(21) Appl. No.: 14/513,725

(22) Filed: Oct. 14, 2014

(65) Prior Publication Data

US 2016/0104707 A1  Apr. 14, 2016

(51) Int. Cl.
*H01L 29/49* (2006.01)
*H01L 27/092* (2006.01)
*H01L 29/51* (2006.01)
*H01L 21/8238* (2006.01)
*H01L 21/225* (2006.01)
*H01L 21/02* (2006.01)
*H01L 21/28* (2006.01)

(52) U.S. Cl.
CPC ...... *H01L 27/0922* (2013.01); *H01L 21/02192* (2013.01); *H01L 21/02247* (2013.01); *H01L 21/2255* (2013.01); *H01L 21/28088* (2013.01); *H01L 21/28185* (2013.01); *H01L 21/823842* (2013.01); *H01L 29/4966* (2013.01); *H01L 29/517* (2013.01); *H01L 21/02252* (2013.01); *H01L 21/02255* (2013.01)

(58) Field of Classification Search
CPC .............. H01L 21/823807; H01L 21/823842; H01L 21/823857; H01L 21/82345; H01L 21/823462; H01L 21/28088; H01L 21/28185; H01L 29/1054; H01L 29/165; H01L 29/4966; H01L 29/66545; H01L 29/66606; H01L 29/7848
USPC ......... 257/211, 411, 351, 371, 369, 204, 410; 438/216, 199, 287
See application file for complete search history.

(56) References Cited

U.S. PATENT DOCUMENTS

| | | | | |
|---|---|---|---|---|
| 7,838,908 | B2 * | 11/2010 | Kwon | H01L 21/823807 257/204 |
| 8,309,419 | B2 * | 11/2012 | Schaeffer | H01L 21/823807 438/199 |
| 8,378,498 | B2 | 2/2013 | Blackshear | |
| 8,420,473 | B2 * | 4/2013 | Ando | H01L 21/823842 257/369 |
| 8,445,344 | B2 * | 5/2013 | Carter | H01L 21/28088 257/E21.625 |
| 8,450,946 | B1 | 5/2013 | Lunn et al. | |
| 8,581,351 | B2 * | 11/2013 | Ando | H01L 21/823842 257/369 |
| 2011/0115027 | A1 * | 5/2011 | Jagannathan | H01L 21/28088 257/369 |
| 2012/0061772 | A1 | 3/2012 | Guo et al. | |
| 2012/0280288 | A1 | 11/2012 | Ando et al. | |

(Continued)

*Primary Examiner* — Kenneth Parker
*Assistant Examiner* — Bo Fan
(74) *Attorney, Agent, or Firm* — Heslin Rothenberg Farley & Mesiti P.C.

(57) ABSTRACT

Embodiments of the present invention provide CMOS structures and methods of gate formation that combine a keep-cap scheme in which a protective layer is maintained on a PFET during a replacement metal gate process that utilizes an NFET-first process flow. Selective nitridation is used to provide nitrogen to the NFET while the PFET is protected from nitrogen by the keep-cap. Additional dopants are provided to the NFET using a gate stack dopant material (GSDM) layer.

16 Claims, 11 Drawing Sheets

(56) References Cited

U.S. PATENT DOCUMENTS

| | | |
|---|---|---|
| 2013/0049123 A1 | 2/2013 | Baars et al. |
| 2013/0082332 A1 | 4/2013 | Liu et al. |
| 2013/0161764 A1 | 6/2013 | Wong et al. |
| 2013/0187236 A1 | 7/2013 | Xie et al. |
| 2013/0187239 A1* | 7/2013 | Chudzik ......... H01L 21/823842 257/369 |
| 2013/0256802 A1 | 10/2013 | Jagannathan et al. |
| 2014/0131808 A1 | 5/2014 | Ando et al. |

* cited by examiner

METHOD AND STRUCTURE FOR TRANSISTORS USING GATE STACK DOPANTS WITH MINIMAL NITROGEN PENETRATION

FIELD OF THE INVENTION

The present invention relates generally to semiconductor fabrication, and more particularly, to transistor gate structures and methods of formation.

BACKGROUND OF THE INVENTION

Field effect transistors (FETs) are widely used for computing, switching, amplification, filtering, and other tasks related to both analog and digital electrical signals. Most common among these are metal-oxide-semiconductor (MOS) field-effect transistors (MOSFETs), in which a gate structure is energized to create an electric field in an underlying channel region of a semiconductor body, by which electrons or holes are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and other circuitry. Continuing trends in semiconductor device manufacturing include reduction in electrical device feature sizes as well as improvements in device performance in terms of device switching speed and power consumption. It is therefore desirable to have improvements in the fabrication of transistors to support these trends.

SUMMARY OF THE INVENTION

In a first aspect, embodiments of the present invention provide a method of forming a semiconductor structure comprising an N-type region and a P-type region, the method comprising: forming a dielectric layer on a semiconductor substrate; forming a keep-cap layer on the dielectric layer; removing the keep-cap layer from the N-type region while preserving the keep-cap layer on the P-type region; forming a gate stack dopant material (GSDM) layer on the dielectric layer in the N-type region and simultaneously forming the GSDM layer on the keep-cap layer in the P-type region; forming a sacrificial titanium nitride layer on the GSDM layer; performing an anneal; removing the sacrificial titanium nitride layer; removing the GSDM layer from a top surface of the dielectric layer in the N-type region, while preserving the GSDM layer in the P-type region; performing a selective nitridation process; forming an N work function metal (NWFM) stack on the dielectric layer in the N-type region, and on the GSDM layer in the P-type region; removing the NWFM stack from the P-type region; removing the GSDM layer in the P-type region; and forming a P work function metal (PWFM) stack on the keep-cap layer in the P-type region and on the NWFM stack in the N-type region.

In a second aspect, embodiments of the present invention provide method of forming a semiconductor structure comprising an N-type region and a P-type region, the method comprising: forming a dielectric layer on a semiconductor substrate; forming a keep-cap layer on the dielectric layer; removing the keep-cap layer from the N-type region while preserving the keep-cap layer on the P-type region; forming a gate stack dopant material (GSDM) layer on the dielectric layer in the N-type region and simultaneously forming the GSDM layer on the keep-cap layer in the P-type region; forming a sacrificial titanium nitride layer on the GSDM layer; performing an anneal; removing the sacrificial titanium nitride layer; removing the GSDM layer from a top surface of the dielectric layer in the N-type region, while preserving the GSDM layer in the P-type region; performing a selective nitridation process; removing the GSDM layer from the N-type region and the P-type region; forming a P work function metal (PWFM) stack on the keep-cap layer in the P-type region and on the dielectric layer in the N-type region; removing the PWFM stack from the N-type region; and forming an N work function metal (NWFM) stack on the dielectric layer in the N-type region, and on the PWFM stack in the P-type region.

In a third aspect, embodiments of the present invention provide semiconductor structure, comprising: a semiconductor substrate comprising an N-type field effect transistor (NFET) region and a P-type field effect transistor (PFET) region; a dielectric layer disposed on the semiconductor substrate; a keep-cap layer disposed on the dielectric layer in the PFET region; an N-type work function metal (NWFM) stack disposed on the dielectric layer in the NFET region; a P-type work function metal (PWFM) stack disposed on the keep-cap layer in the PFET region, and on the NWFM stack in the NFET region; and a fill metal disposed on the PWFM stack.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
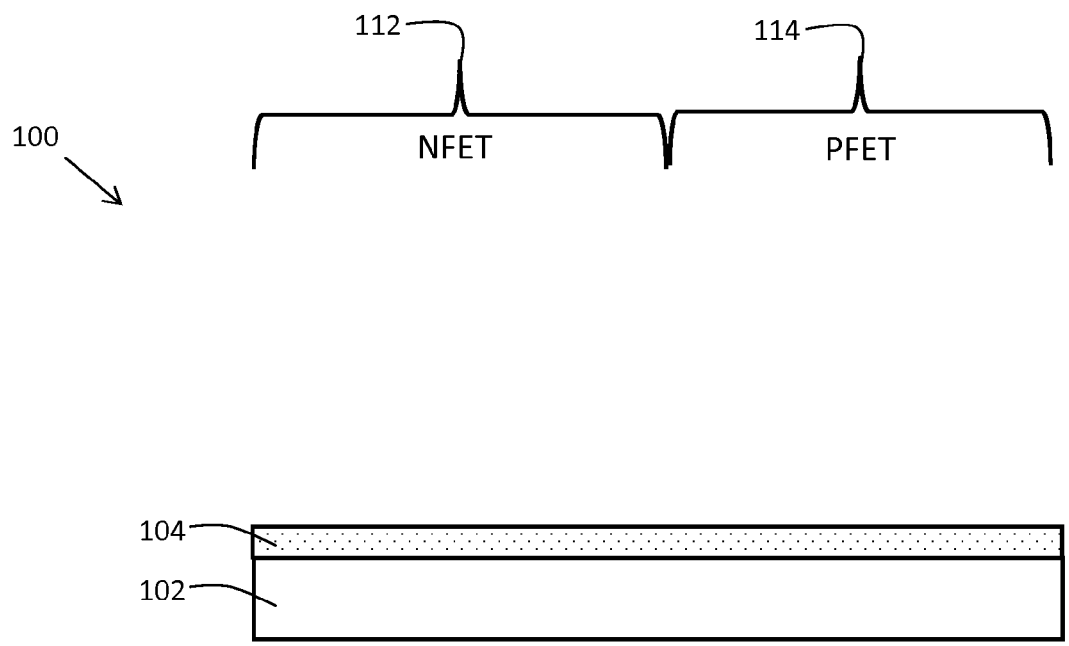

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a semiconductor structure at a starting point for embodiments of the present invention.

Figure 2:
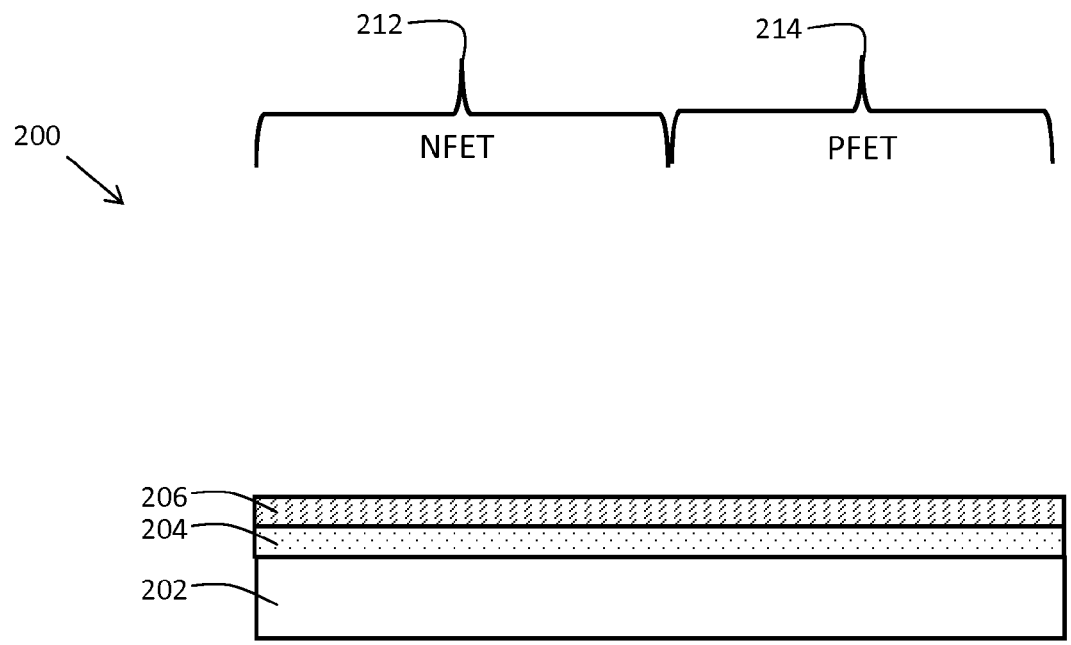

FIG. 2 shows a semiconductor structure after a subsequent process step of depositing a keep-cap layer.

Figure 3:
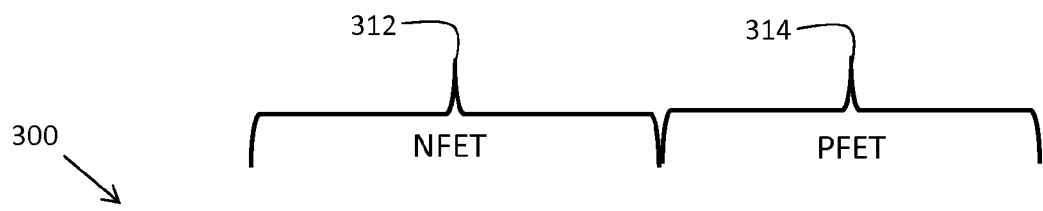
Figure 3:
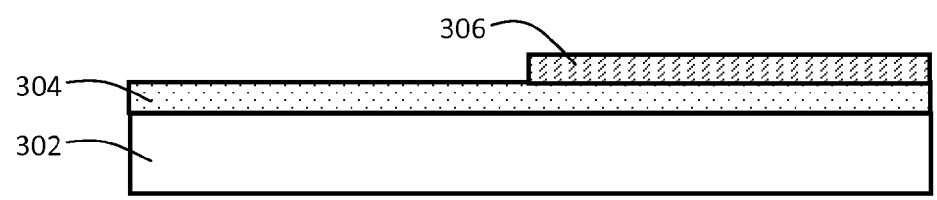

FIG. 3 shows a semiconductor structure after a subsequent process step of patterning the keep-cap layer.

Figure 4:
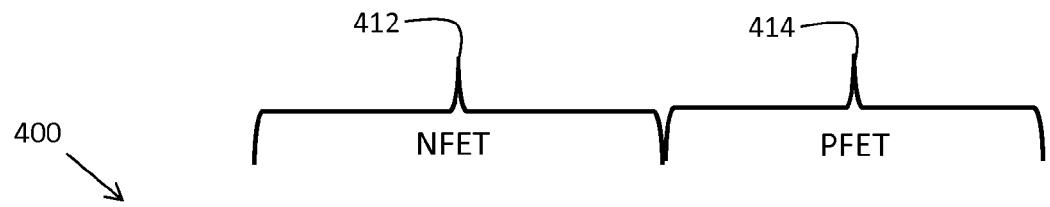
Figure 4:
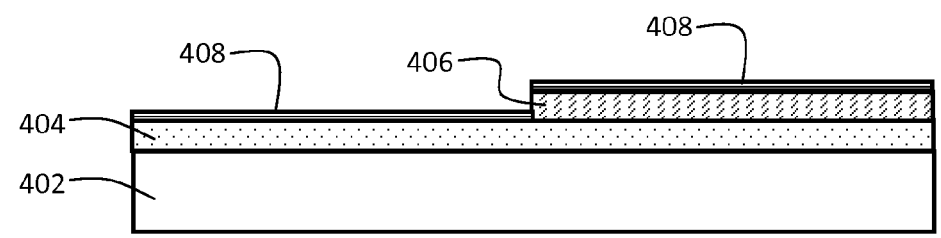

FIG. 4 shows a semiconductor structure after a subsequent process step of depositing a gate stack dopant material (GSDM) layer.

Figure 5:
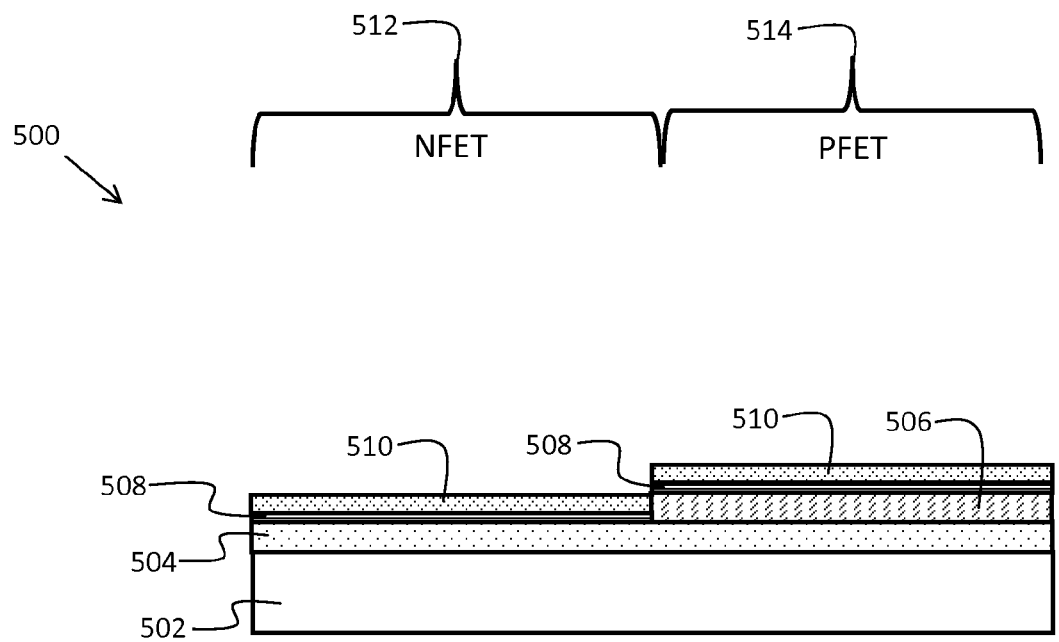

FIG. 5 shows a semiconductor structure after a subsequent process step of depositing a first sacrificial layer.

Figure 6:
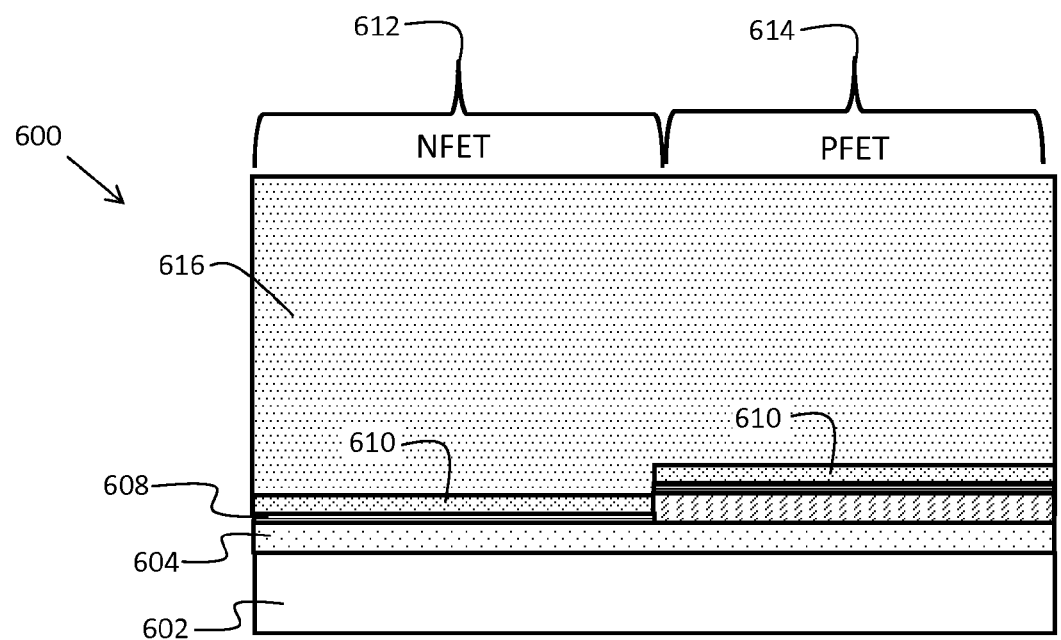

FIG. 6 shows a semiconductor structure after a subsequent process step of depositing a second sacrificial layer.

Figure 7:
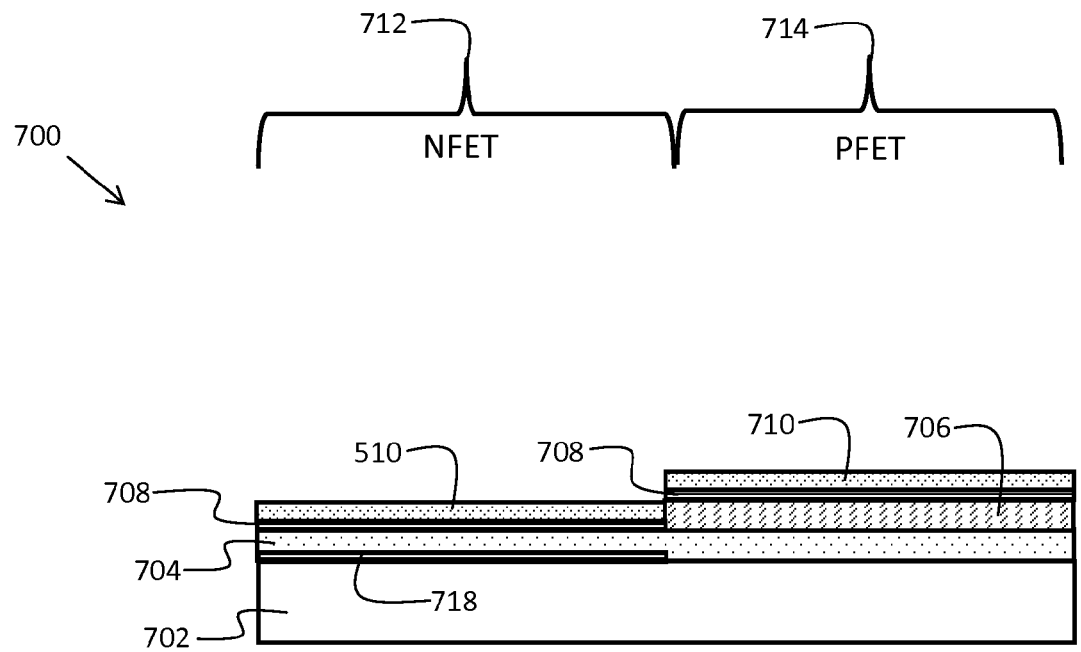

FIG. 7 shows a semiconductor structure after subsequent process steps of performing an anneal and removal of the second sacrificial layer.

Figure 8:
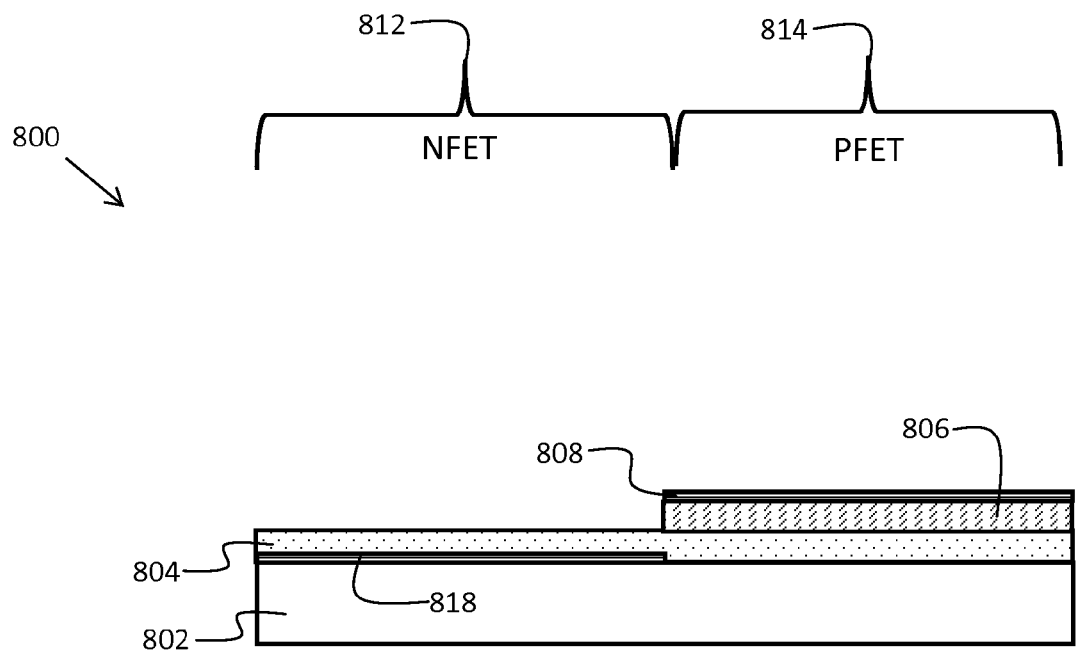

FIG. 8 shows a semiconductor structure after a subsequent process step of removing the first sacrificial layer.

Figure 9:
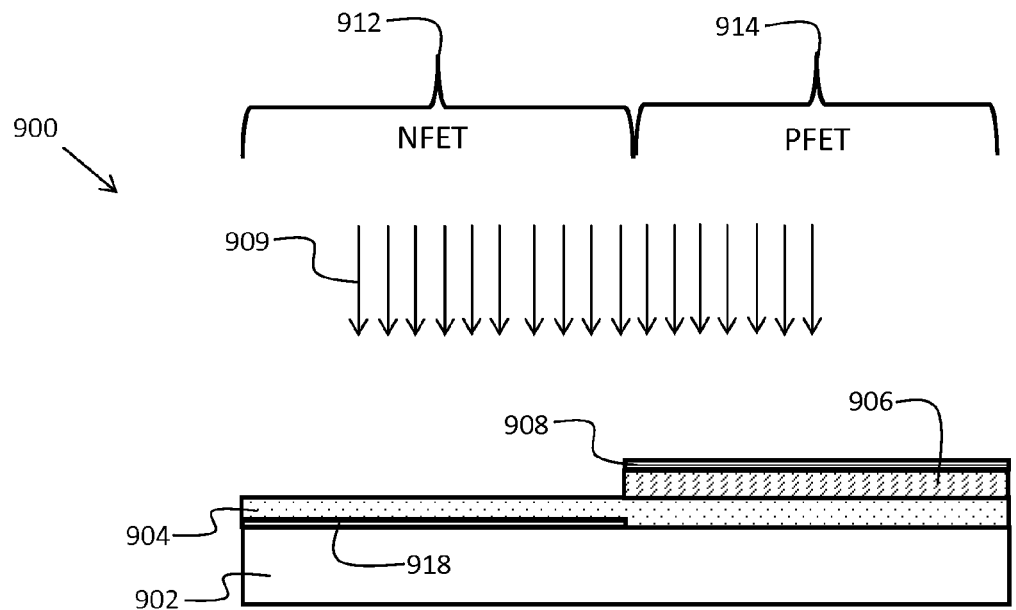

FIG. 9 shows a semiconductor structure after a subsequent process step of performing nitridation.

Figure 10:
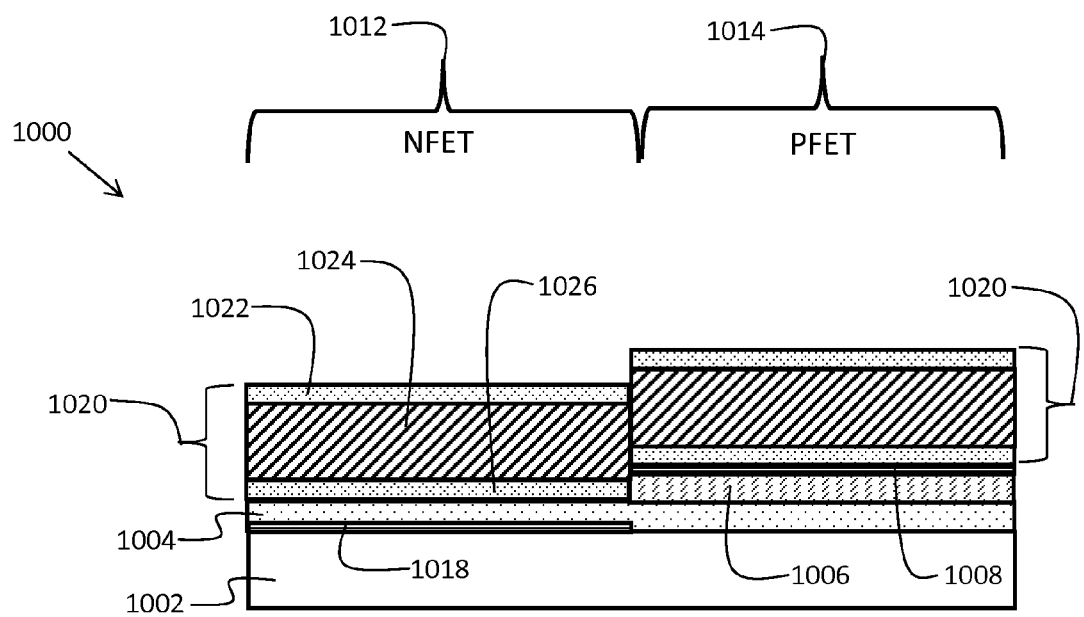

FIG. 10 shows a semiconductor structure after a subsequent process step of depositing an N-type work function metal (NWFM) stack.

Figure 11:
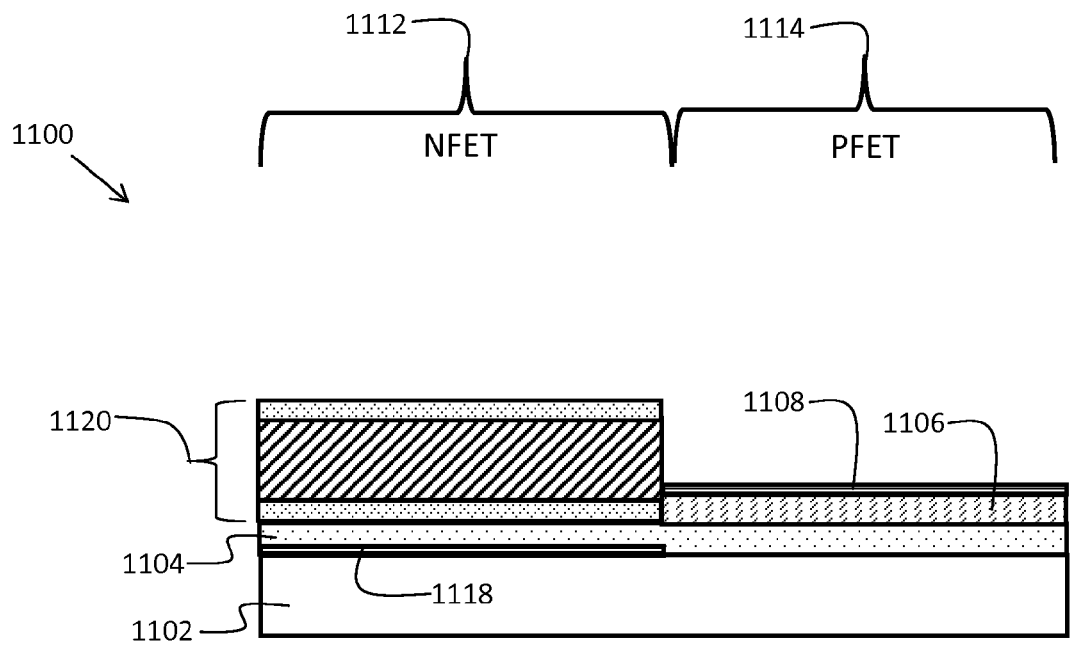

FIG. 11 shows a semiconductor structure after a subsequent process step of removing the NWFM stack from the P-type region.

Figure 12:
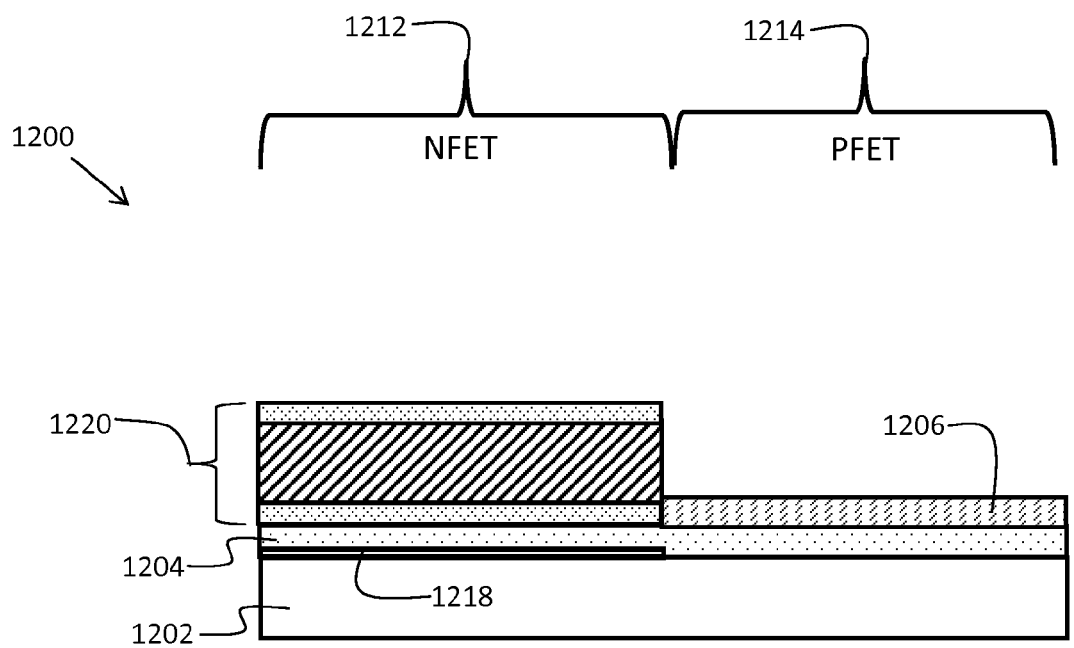

FIG. 12 shows a semiconductor structure after a subsequent process step of removing the GSDM layer from the P-type region.

Figure 13:
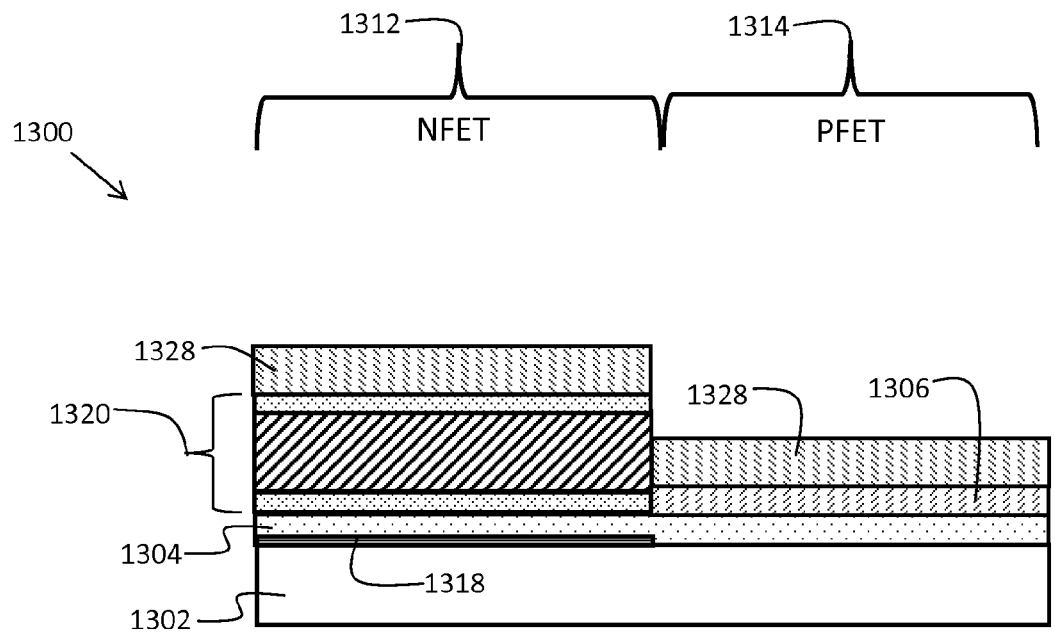

FIG. 13 shows a semiconductor structure after a subsequent process step of depositing a P-type work function metal (PWFM) stack.

Figure 14:
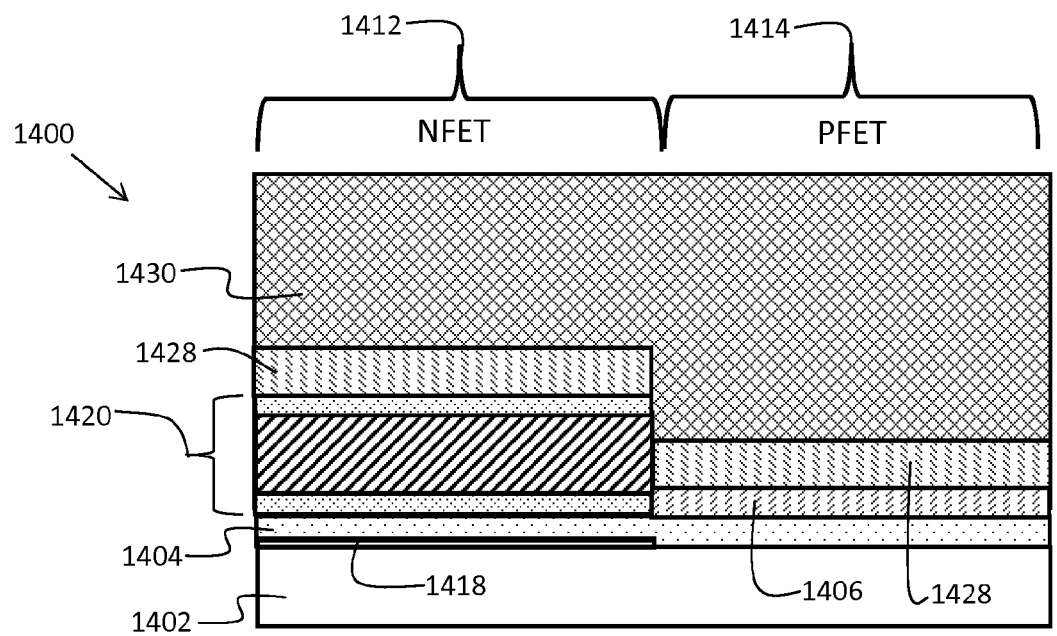

FIG. 14 shows a semiconductor structure after a subsequent process step of depositing a fill metal.

Figure 15:
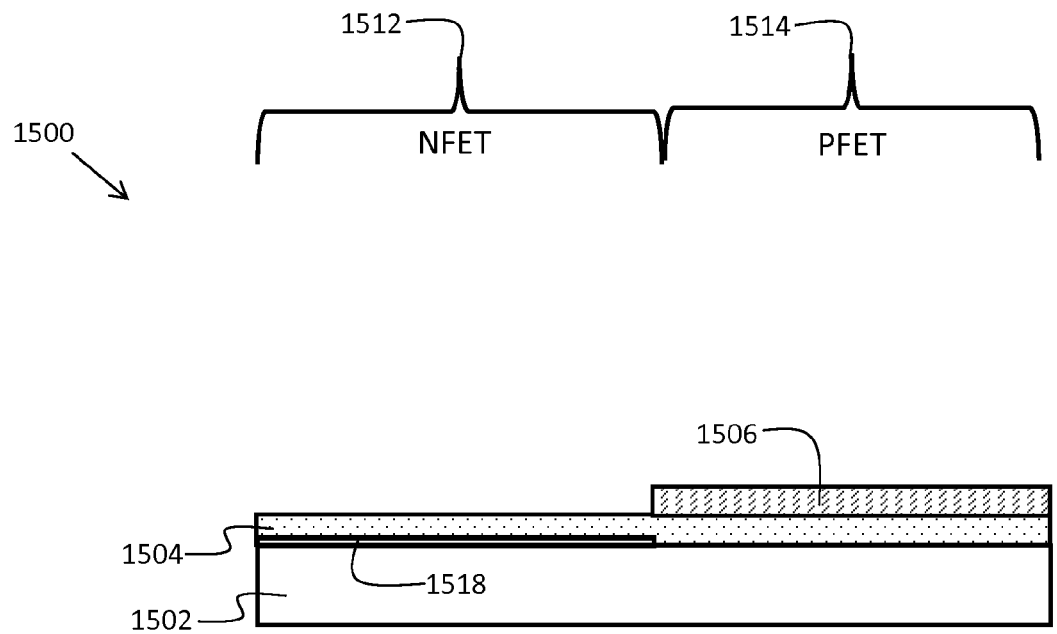

FIG. 15 shows a semiconductor structure in accordance with an alternative embodiment, following from FIG. 9, after a subsequent process step of removing the GSDM layer from the P-type region.

Figure 16:
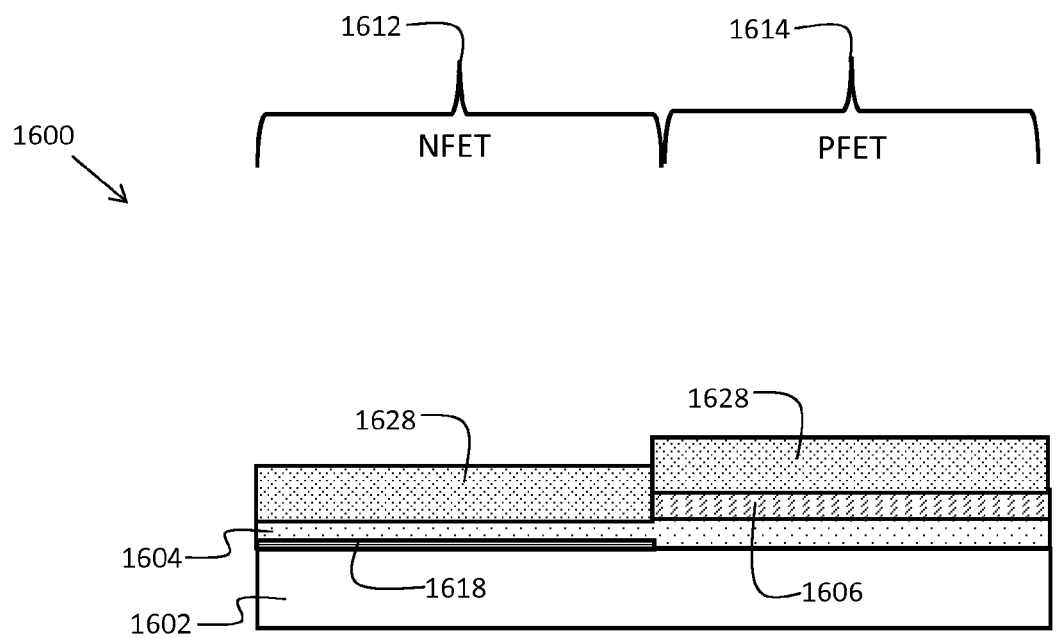

FIG. 16 shows a semiconductor structure, following from FIG. 15, after a subsequent process step of depositing a P-type work function metal (PWFM) stack.

Figure 17:
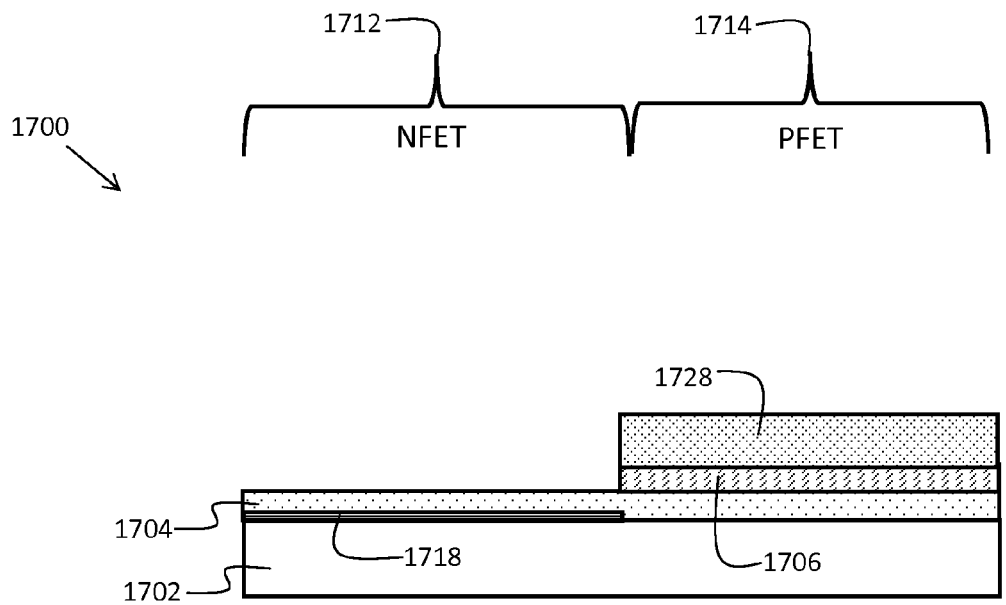

FIG. 17 shows a semiconductor structure, following from FIG. 16, after a subsequent process step of removing the PWFM stack from the N-type region.

Figure 18:
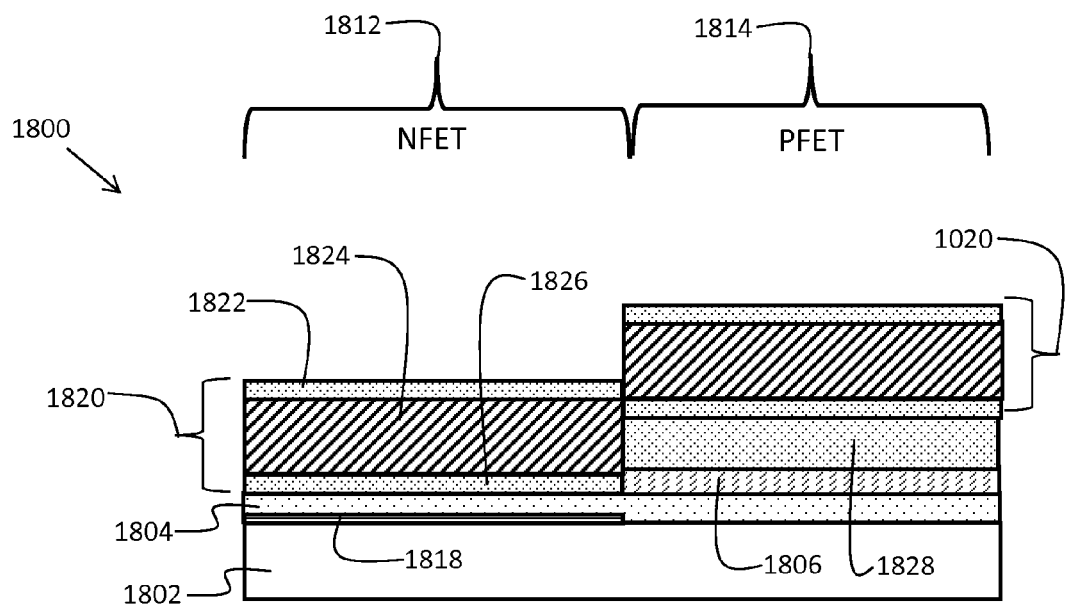

FIG. 18 shows a semiconductor structure, following from FIG. 17, after a subsequent process step of depositing an N-type work function metal (NWFM) stack.

Figure 19:
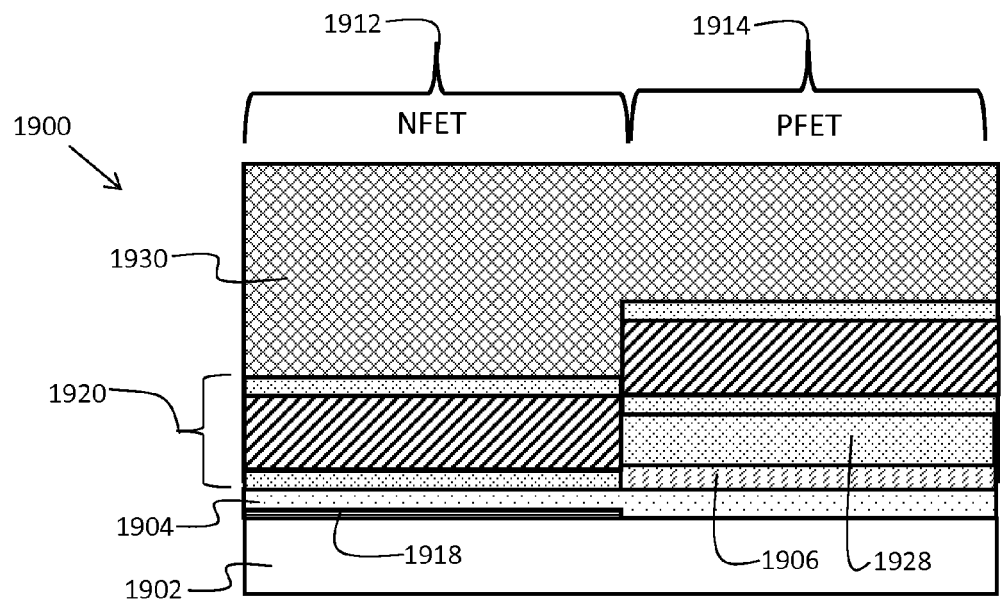

FIG. 19 shows a semiconductor structure, following from FIG. 18, after a subsequent process step of depositing a fill metal.

Figure 20:
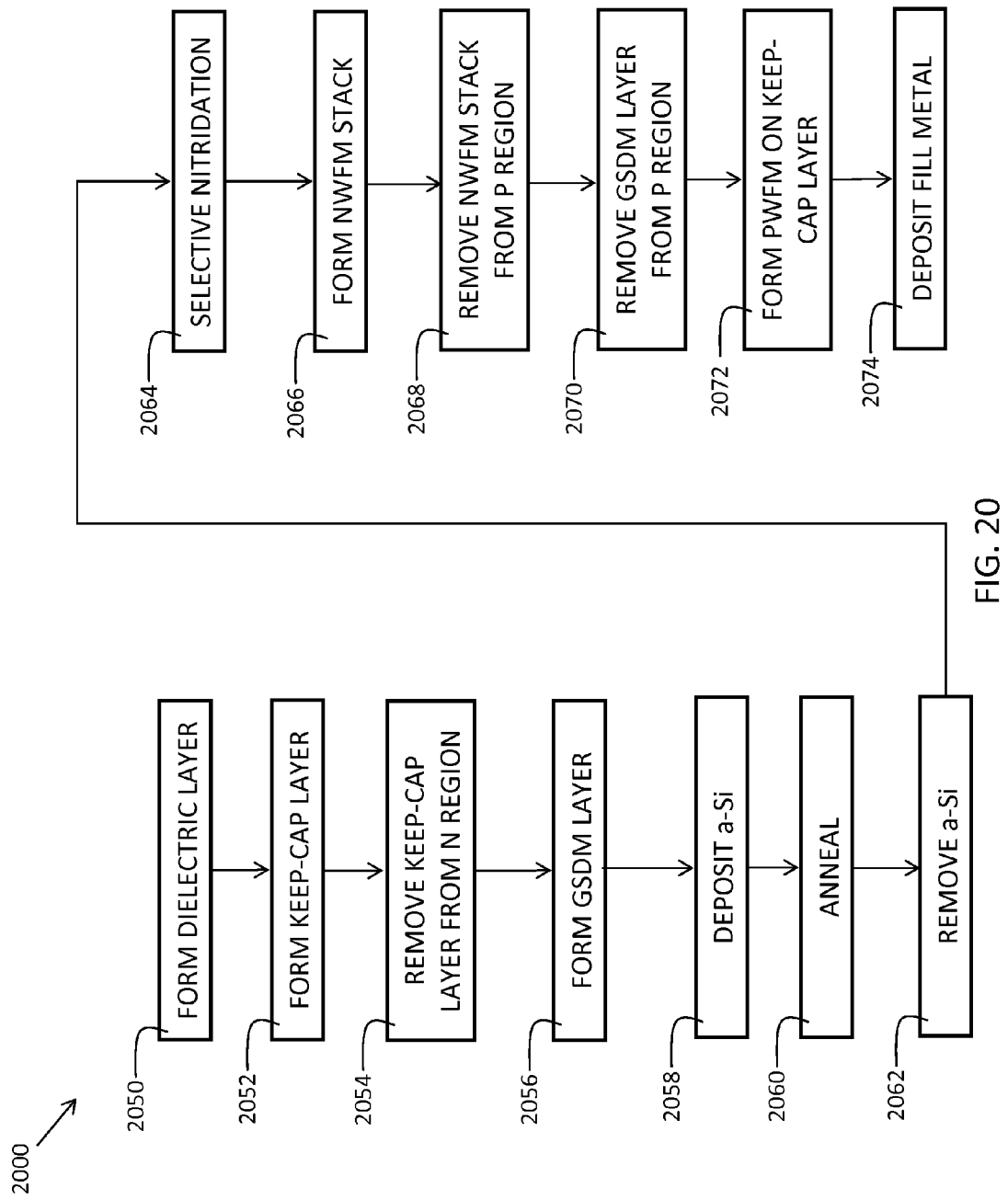

FIG. 20 is a flowchart indicating process steps for embodiments of the present invention.

DETAILED DESCRIPTION

Embodiments of the present invention provide CMOS structures and methods of gate formation that combine a keep-cap scheme in which a protective layer is maintained on a PFET during a replacement metal gate process that utilizes an NFET-first process flow. Selective nitridation is used to provide nitrogen to the NFET while the PFET is protected from nitrogen by the keep-cap. Additional dopants are provided to the NFET using a gate stack dopant material (GSDM) layer.

One of the key goals in advanced nodes is the ability to incorporate, in a replacement metal gate (RMG) process flow, rare-earth dopants such as lanthanum and/or aluminum into the gate stack to improve the device reliability, provide Tiny scaling and also provide multi-Vt capability (i.e. NFETs with different threshold voltages and PFETs with different threshold voltages).

To achieve this patterning, a blocking or barrier layer such as titanium nitride (TiN) may be used to block the dopant from field effect transistors (FETs) that should not incorporate the dopant, while the barrier layer is patterned off for the FETs that are supposed to incorporate the dopant. In embodiments, NFETs are doped with the gate-stack dopant, while PFETs are blocked.

This patterning process incorporates a final step (after dopant drive-in) that may utilize a wet-etch of the entire stack containing the barrier layer (e.g. TiN) and the dopant film to land back on the base dielectric. In embodiments, the base dielectric is a high-K dielectric such as hafnium oxide. Then, work function metals containing TiN (and other metals) to achieve the desired device properties (e.g. Vt) are deposited on the CMOS structure.

Thus, embodiments of the present invention prevent repeated exposure of the PFET gate stack by using an innovative technique that selectively preserves the barrier layer that is deposited on the PFET from being etched away during subsequent processing, thereby preventing the further incorporation of nitrogen into the PFETs in a CMOS gate-stack dopant process. Embodiments of the present invention may be utilized in both planar and fin-based devices. Additionally, embodiments of the present invention may be utilized in both bulk, and semiconductor-on-insulator (SOI) structures.

FIG. 1 shows a semiconductor structure 100 at a starting point for embodiments of the present invention. Semiconductor structure 100 comprises semiconductor substrate 102. In embodiments, semiconductor substrate 102 may comprise a silicon substrate, silicon germanium substrate, or other suitable material. Dielectric layer 104 is disposed on semiconductor substrate 102. In embodiments, dielectric layer 104 is a high-K dielectric layer (K>4). In embodiments, dielectric layer 104 is comprised of hafnium oxide. In some embodiments, dielectric layer 104 may include, but is not limited to, hafnium silicon oxide, zirconium oxide, zirconium silicon oxide, titanium oxide, tantalum oxide, barium strontium titanium oxide, barium titanium oxide, strontium titanium oxide, yttrium oxide, lead scandium tantalum oxide, and/or lead zinc niobate. In embodiments, dielectric layer 104 may be deposited using atomic layer deposition (ALD), chemical vapor deposition (CVD), or other suitable technique. Semiconductor structure 100 comprises an N-type region 112 (the left half of structure 100), and a P-type region 114 (the right half of structure 100). After completion of the fabrication process, an NFET gate is formed on region 112, while a PFET gate is formed on region 114. Hence, the terms "N-type region" and "NFET region" may be used interchangeably within this disclosure. Similarly, the terms "P-type region" and "PFET region" may be used interchangeably within this disclosure. Furthermore, note that while the figures show planar films for simplicity, one skilled in the art will appreciate the films may be, and preferably are, applied to an opening of a replacement metal gate.

FIG. 2 shows a semiconductor structure 200 after a subsequent process step of depositing a keep-cap layer 206. In embodiments, the keep-cap layer is comprised of titanium nitride (TiN). In embodiments, the keep-cap layer may be deposited using CVD, or other suitable technique. As stated previously, similar elements may be referred to by similar numbers in various figures (FIGs) of the drawing, in which case typically the last two significant digits may be the same. For example, semiconductor substrate 202 of FIG. 2 is similar to semiconductor substrate 102 of FIG. 1.

FIG. 3 shows a semiconductor structure 300 after a subsequent process step of patterning the keep-cap layer. Thus, keep-cap layer 306 is patterned to be only in the P-type region 314, and is removed from the N-type region 312. This may be accomplished using industry standard lithographic and etch techniques, which entail patterning a mask layer (not shown) over the keep-cap layer in the P-type region 314 and then performing a selective etch to remove the keep-cap layer in the N-type region 312.

FIG. 4 shows a semiconductor structure 400 after a subsequent process step of depositing a gate stack dopant material (GSDM) layer 408. The GSDM layer is disposed directly on the dielectric layer 404 in the N-type region 412. Simultaneously, the GSDM layer is also disposed directly on the keep-cap layer 406 in the P-type region 414. In embodiments, the GSDM layer is comprised of lanthanum oxide. In embodiments, the GSDM layer may include, but is not limited to, oxides of lanthanide (e.g., La, Lu) or alkaline earth (e.g., Sr) metals, Aluminum Oxide, Magnesium Oxide, and/or various combinations of these metal oxides. In embodiments, the GSDM layer 408 is deposited using an atomic layer deposition (ALD) process.

FIG. 5 shows a semiconductor structure 500 after a subsequent process step of depositing a first sacrificial layer 510. In embodiments, the first sacrificial layer 510 is comprised of titanium nitride. In embodiments, the first sacrificial layer 510 is deposited via atomic layer deposition (ALD), chemical vapor deposition (CVD), or other suitable technique.

FIG. 6 shows a semiconductor structure 600 after a subsequent process step of depositing a second sacrificial layer 616. In embodiments, the second sacrificial layer is comprised of amorphous silicon (a-Si). A purpose of the second sacrificial layer is to provide protection during an upcoming anneal process. Amorphous silicon blocks ambient oxygen from diffusing into the gate stack materials. This is important because if the ambient oxygen diffuses through the gate stack it could react with the transistor channel (not shown) below the gate. This can lead to the formation of additional oxide underneath the dielectric layer, potentially causing a Tiny increase, that in turn leads to poor device performance. Thus the second sacrificial layer 616 serves an important purpose in mitigating these problems. In embodiments, the second sacrificial layer 616 is deposited by a chemical vapor deposition (CVD) process.

FIG. 7 shows a semiconductor structure 700 after subsequent process steps of performing an anneal and removal of the second sacrificial layer (compare with 616 of FIG. 6). In embodiments, the anneal is performed at a temperature range of about 950 degrees Celsius to about 1000 degrees Celsius. After the anneal, the second sacrificial layer (e.g. a-Si) is removed. In embodiments, the sacrificial layer comprised of a-Si is removed using a hot ammonia process. As a result of the anneal, dopants from the GSDM layer are diffused through the dielectric layer 704 to substrate 702, as indicated by dopant layer 718. Thus, in embodiments, the dielectric layer comprises lanthanum in the NFET region (N-type region 712) and the dielectric layer does not comprise lanthanum in the PFET region (P-type region 714).

FIG. 8 shows a semiconductor structure 800 after a subsequent process step of removing the first sacrificial layer (compare with 710 of FIG. 7). In an embodiment where the GSDM layer 808 is comprised of lanthanum oxide, the GSDM layer 808 acts as an etch stop for a keep-cap layer 806 comprised of TiN, and the GSDM layer 808 is still present in P-type region 814. However, the GSDM layer is removed from the top surface of dielectric layer 804 in the N-type region 812. Thus, in embodiments, a selectivity is achieved by depositing lanthanum oxide on titanium nitride, creating a lanthanum nitride interface. This enables a process flow in which the lanthanum oxide is not removed from the top surface of the keep-cap region 806. However, that selectivity does not occur when the lanthanum oxide is deposited on a dielectric layer 804, which may comprise hafnium oxide.

FIG. 9 shows a semiconductor structure 900 after a subsequent process step of performing nitridation. Nitrogen, as indicated by arrows 909, is applied to the structure 900. The keep-cap layer 906 prevents nitrogen from entering the substrate 902 in the P-type region. However, as the keep-cap layer is not present on the N-type region, the nitrogen is applied to substrate 902 in the N-type region. Incorporation of nitrogen into NFETs is typically advantageous for reliability (positive bias temperature instability). However, it is detrimental to PFET reliability (negative bias temperature instability). Hence, the keep-cap layer 906 prevents the adverse effects of nitrogen in the P-type region, while the nitrogen is able to enter the N-type region to enable the beneficial effects for an NFET.

In embodiments, the nitridation is performed using a decoupled plasma nitridation (DPN). In an embodiment utilizing DPN, inductive coupling is used for plasma formation. RF power is transferred to the plasma via an RF magnetic field which in turn generates an ionizing electric field. In other embodiments, the nitridation is performed using a rapid thermal nitridation (RTN) process with ammonia. In an embodiment using RTN, the RTN process is performed at a temperature of between about 850 degrees Celsius and about 900 degrees Celsius and at a pressure of between about 720 and about 760 Torr in an ammonia-containing atmosphere.

FIG. 10 shows a semiconductor structure 1000 after a subsequent process step of depositing an N-type work function metal (NWFM) stack 1020. The NWFM stack may include a plurality of sub-layers 1022, 1024, and 1026. In embodiments, outer sub-layers 1022 and 1026 are comprised of titanium nitride, while the middle sub-layer 1024 is comprised of a different material, which may comprise a material including, but not limited to, titanium aluminide (TiAl), or TiAlC. The NWFM stack facilitates control over important NFET parameters such as threshold voltage (Vt). The NWFM stack 1020 is disposed in direct physical contact with dielectric layer 1004 in the N-type region 1012, whereas the NWFM stack 1020 is disposed on the GSDM layer 1008 in the P-type region 1014.

FIG. 11 shows a semiconductor structure 1100 after a subsequent process step of removing the NWFM stack from the P-type region. Thus, NWFM stack 1120 exists only in N-type region 1112. GSDM layer 1108 serves as an etch stop layer in the P-type region. In embodiments, the removal of the NWFM stack is achieved using an SC1 etch that comprises hydrogen peroxide and ammonium hydroxide. Those etchants allow selective removal of the NWFM stack.

FIG. 12 shows a semiconductor structure 1200 after a subsequent process step of removing the GSDM layer from the P-type region (compare with 1108 of FIG. 11). In embodiments, the GSDM layer may be removed using a hydrochloric acid (HCl) etch process.

FIG. 13 shows a semiconductor structure 1300 after a subsequent process step of depositing a P-type work function metal (PWFM) stack 1328. In embodiments, the PWFM stack 1328 may include a single layer of titanium nitride. In other embodiments, multiple sub-layers (not shown) may comprise the PWFM stack. The PWFM stack facilitates control over important PFET parameters such as threshold voltage (Vt). The PWFM stack 1328 is disposed directly on keep-cap layer 1306. In embodiments, both keep-cap layer 1306 and PWFM stack 1328 are comprised of titanium nitride.

FIG. 14 shows a semiconductor structure 1400 after a subsequent process step of depositing a fill metal 1430. In embodiments, the fill metal 1430 comprises tungsten. The process may include deposition of tungsten, followed by a planarization process, such as a chemical mechanical polish (CMP) process. From this point forward, industry-standard techniques may be used to complete fabrication of the integrated circuit.

As can now be appreciated, embodiments of the present invention provide an N-first RMG flow that provides nitridation to the NFET gate, while utilizing a keep-cap layer on the PFET gate to protect the PFET from the adverse effects of nitridation. One advantage of an N-first RMG flow is that the PWFM layer is disposed directly on the keep-cap layer, with the NWFM layer already in place, and removed from the P-type region. This allows a greater volume of fill metal 1430 in the P-type region, reducing device resistance, resulting in improved PFET performance. However, embodiments of the present invention can also be utilized in a P-first RMG flow, in such a case where it is desirable to do so. The process steps described for FIGS. 1-9 are common to both the N-first RMG flow and the P-first RMG flow. FIGS. 15-19 describe details specific to a P-first RMG flow. Thus, FIG. 15 follows from FIG. 9, and begins description of an alternative embodiment.

FIG. 15 shows a semiconductor structure 1500 in accordance with an alternative embodiment, following from FIG. 9, after a subsequent process step of removing the GSDM layer from the P-type region (compare with 908 of FIG. 9). Thus, while in the N-first RMG flow, the GSDM layer remains on the P-type region (see 1008 of FIG. 10), in the P-first RMG flow, the GSDM layer is removed). In embodiments, the GSDM layer may be removed using a hydrochloric acid (HCl) etch process.

FIG. 16 shows a semiconductor structure 1600, following from FIG. 15, after a subsequent process step of depositing a P-type work function metal (PWFM) stack 1628. In embodiments, the PWFM stack 1628 may include a single layer of titanium nitride. In other embodiments, multiple sub-layers (not shown) may comprise the PWFM stack. The PWFM stack facilitates control over important PFET parameters such as threshold voltage (Vt).

FIG. 17 shows a semiconductor structure 1700, following from FIG. 16, after a subsequent process step of removing the PWFM stack from the N-type region 1712 (compare with 1628 of FIG. 16). In embodiments, the PWFM stack is removed with a selective wet etch process.

FIG. 18 shows a semiconductor structure 1800, following from FIG. 17, after a subsequent process step of depositing an N-type work function metal (NWFM) stack 1820. The NWFM stack may include a plurality of sub-layers 1822, 1824, and 1826. In embodiments, outer sub-layers 1822 and 1826 are comprised of titanium nitride, while the middle sub-layer 1824 is comprised of a different material, which may comprise a material including, but not limited to, titanium aluminide (TiAl), or TiAlC. The NWFM stack facilitates control over important NFET parameters such as threshold voltage (Vt).

FIG. 19 shows a semiconductor structure 1900, following from FIG. 18, after a subsequent process step of depositing a fill metal 1930. The process may include deposition of tungsten, followed by a planarization process, such as a chemical mechanical polish (CMP) process. From this point forward, industry-standard techniques may be used to complete fabrication of the integrated circuit. As can now be appreciated, alternative embodiments of the present invention provide a P-first RMG flow that provides nitridation to the NFET gate, while utilizing a keep-cap layer on the PFET gate to protect the PFET from the adverse effects of nitridation.

FIG. 20 is a flowchart 2000 indicating process steps for embodiments of the present invention. In process step 2050, a dielectric layer is formed (see 104 of FIG. 1). In process step 2052, a keep-cap layer is formed (see 206 of FIG. 2). In process step 2054, the keep-cap layer is removed from the N-type region, which is the side where an NFET gate is to be formed (see 300 of FIG. 3). In process step 2056, a gate stack dopant material (GSDM) layer is formed (see 408 of FIG. 4). In process step 2058, a protective layer of amorphous silicon (a-Si) is deposited (see 616 of FIG. 6). A first sacrificial layer may be deposited prior to the a-Si (see 510 of FIG. 5). The protective layers are used as protection for the structure during the anneal of process step 2060. The anneal diffuses dopants from the GSDM towards the substrate in the N-type region. In embodiments, the dopants from the GSDM include lanthanum and/or aluminum. In process step 2062, the a-Si layer is removed (see 700 of FIG. 7). In process step 2064, a selective nitridation is performed (see 900 of FIG. 9). Prior to the selective nitridation, the first sacrificial layer (see 510 of FIG. 5) may be removed. In process step 2066, an NWFM stack is formed (see 1020 of FIG. 10). In process step 2068, the NWFM stack is removed from the P-type region (see 1100 of FIG. 11). In process step 2070, the GSDM layer is removed from the P-type region (see 1200 of FIG. 12). In process step 2072, a PWFM stack (which may comprise a single layer) is formed on the keep-cap layer (see 1328 of FIG. 13). In process step 2074, a fill metal, such as tungsten, is deposited (see 1430 of FIG. 14).

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure comprising an N-type region and a P-type region, the method comprising:
    forming a dielectric layer on a semiconductor substrate;
    forming a keep-cap layer on the dielectric layer;
    removing the keep-cap layer from the N-type region while preserving the keep-cap layer on the P-type region;
    forming a gate stack dopant material (GSDM) layer on the dielectric layer in the N-type region and simultaneously forming the GSDM layer on the keep-cap layer in the P-type region;
    forming a sacrificial titanium nitride layer on the GSDM layer;
    performing an anneal;
    removing the sacrificial titanium nitride layer;
    removing the GSDM layer from a top surface of the dielectric layer in the N-type region, while preserving the GSDM layer in the P-type region;
    performing a selective nitridation process;
    forming an N work function metal (NWFM) stack on the dielectric layer in the N-type region, and on the GSDM layer in the P-type region;
    removing the NWFM stack from the P-type region;
    removing the GSDM layer in the P-type region; and
    forming a P work function metal (PWFM) stack on the keep-cap layer in the P-type region and on the NWFM stack in the N-type region.

2. The method of claim 1, further comprising forming a fill metal on the PWFM stack.

3. The method of claim 1, wherein forming a fill metal on the PWFM stack comprises depositing a tungsten layer on the PWFM stack.

4. The method of claim 1, further comprising:
    forming an amorphous silicon layer on the sacrificial titanium nitride layer prior to performing the anneal; and
    removing the amorphous silicon layer after performing the anneal.

5. The method of claim 4, wherein performing the anneal comprises performing the anneal at a process temperature ranging from about 950 degrees Celsius to about 1000 degrees Celsius.

6. The method of claim 1, wherein forming the GSDM layer comprises depositing lanthanum oxide.

7. The method of claim 1, wherein performing the selective nitridation process comprises a decoupled plasma nitridation process.

8. The method of claim 1, wherein performing the selective nitridation process comprises a rapid thermal nitridation process with ammonia.

9. A method of forming a semiconductor structure comprising an N-type region and a P-type region, the method comprising:
   forming a dielectric layer on a semiconductor substrate;
   forming a keep-cap layer on the dielectric layer;
   removing the keep-cap layer from the N-type region while preserving the keep-cap layer on the P-type region;
   forming a gate stack dopant material (GSDM) layer on the dielectric layer in the N-type region and simultaneously forming the GSDM layer on the keep-cap layer in the P-type region;
   forming a sacrificial titanium nitride layer on the GSDM layer;
   performing an anneal;
   removing the sacrificial titanium nitride layer;
   removing the GSDM layer from a top surface of the dielectric layer in the N-type region, while preserving the GSDM layer in the P-type region;
   performing a selective nitridation process;
   removing the GSDM layer from the N-type region and the P-type region;
   forming a P work function metal (PWFM) stack on the keep-cap layer in the P-type region and on the dielectric layer in the N-type region;
   removing the PWFM stack from the N-type region; and
   forming an N work function metal (NWFM) stack on the dielectric layer in the N-type region, and on the PWFM stack in the P-type region.

10. The method of claim 9, further comprising forming a fill metal on the PWFM stack.

11. The method of claim 10, wherein forming a fill metal on the PWFM stack comprises depositing a tungsten layer on the PWFM stack.

12. The method of claim 9, further comprising:
   forming an amorphous silicon layer on the sacrificial titanium nitride layer prior to performing the anneal; and
   removing the amorphous silicon layer after performing the anneal.

13. The method of claim 12, wherein performing the anneal comprises performing the anneal at a process temperature ranging from about 950 degrees Celsius to about 1000 degrees Celsius.

14. The method of claim 9, wherein forming the GSDM layer comprises depositing lanthanum oxide.

15. The method of claim 9, wherein performing the selective nitridation process comprises a decoupled plasma nitridation process.

16. The method of claim 9, wherein performing the selective nitridation process comprises a rapid thermal nitridation process with ammonia.

* * * * *